U S008045938B2

(12) United States Patent
Hosokawa et al.

(10) Patent No.: US 8,045,938 B2
(45) Date of Patent: Oct. 25, 2011

(54) DISCRETE FILTER, SAMPLING MIXER, AND RADIO DEVICE

(75) Inventors: Yoshifumi Hosokawa, Osaka (JP); Noriaki Saito, Tokyo (JP); Yoshito Shimizu, Kanagawa (JP); Katsuaki Abe, Osaka (JP)

(73) Assignee: Panasonic Corporation, Osaka (JP)

( * ) Notice: Subject to any disclaimer, the term of this patent is extended or adjusted under 35 U.S.C. 154(b) by 478 days.

(21) Appl. No.: 12/304,011

(22) PCT Filed: Jun. 19, 2007

(86) PCT No.: PCT/JP2007/062329
§ 371 (c)(1),
(2), (4) Date: Dec. 9, 2008

(87) PCT Pub. No.: WO2007/148693
PCT Pub. Date: Dec. 27, 2007

(65) Prior Publication Data
US 2010/0248675 A1  Sep. 30, 2010

(30) Foreign Application Priority Data
Jun. 20, 2006  (JP) ................. 2006-170452

(51) Int. Cl.
*H01Q 11/12* (2006.01)
*H03B 1/00* (2006.01)
(52) U.S. Cl. .................... 455/118; 327/552; 327/553
(58) Field of Classification Search ................ None
See application file for complete search history.

(56) References Cited

U.S. PATENT DOCUMENTS

| 6,963,732 | B2 | 11/2005 | Muhammad et al. |
| 7,003,276 | B2 | 2/2006 | Muhammad et al. |
| 7,272,187 | B2 | 9/2007 | Shimizu |
| 7,589,585 | B2* | 9/2009 | Murata et al. ............ 327/551 |
| 7,623,838 | B2* | 11/2009 | Staszewski et al. ........ 455/319 |
| 7,791,407 | B2* | 9/2010 | Muhammad et al. ........ 327/552 |

(Continued)

FOREIGN PATENT DOCUMENTS

JP    2004-289793 A    10/2004

OTHER PUBLICATIONS

U.S. Appl. No. 12/295,939 to Matsuoka et al., which was filed on Oct. 3, 2008.

*Primary Examiner* — Tuan T Lam
(74) *Attorney, Agent, or Firm* — Greenblum & Bernstein, PLC

(57) ABSTRACT

Provided is a discrete filter capable of increasing degree of freedom of design including a DC gain. A sampling mixer (100) includes: a control signal generation unit (104) which generates a control signal including an SO signal; a Ch (6) which successively integrates reception signals sampled by an LO signal frequency as discrete signals; a plurality of Cr (7, 8) which successively integrate discrete signals at a timing based on the control signal; Cb (15) which alternately integrates the discrete signals successively integrated by the respective Cr (7, 8); and a gain control capacitance unit (110) which has gain control capacitors (44, 45, 46) connected in parallel to the respective Cr (7, 8) and integrating the discrete signal and a reset switch (47) for resetting the discrete signal of the gain control capacitors (44, 45, 46) integrated in the past, upon connection between one end of Cr (7) and Cb (15).

17 Claims, 10 Drawing Sheets

U.S. PATENT DOCUMENTS

| | | |
|---|---|---|
| 2002/0172170 A1 | 11/2002 | Muhammad et al. |
| 2003/0050027 A1 | 3/2003 | Muhammad et al. |
| 2003/0080888 A1 | 5/2003 | Muhammad et al. |
| 2006/0071707 A1* | 4/2006 | Belveze et al. ............... 327/554 |
| 2006/0135107 A1* | 6/2006 | Staszewski et al. ........... 455/307 |
| 2008/0240316 A1* | 10/2008 | Yokoshima et al. .......... 375/350 |
| 2009/0021296 A1* | 1/2009 | Miyano et al. ................. 327/553 |
| 2009/0196384 A1* | 8/2009 | Staszewski et al. ........... 375/346 |
| 2009/0270061 A1* | 10/2009 | Hosokawa et al. ........... 455/323 |
| 2010/0109746 A1* | 5/2010 | Hosokawa et al. ........... 327/355 |
| 2010/0311375 A1* | 12/2010 | Hosokawa et al. ........... 455/227 |
| 2010/0316174 A1* | 12/2010 | Lee et al. ...................... 375/345 |

* cited by examiner

DISCRETE FILTER, SAMPLING MIXER, AND RADIO DEVICE

TECHNICAL FIELD

The present invention relates to a discrete filter, sampling mixer and radio apparatus that carry out digital signal processing such as filtering.

BACKGROUND ART

In a conventional sampling mixer, a filter effect is obtained in a switched capacitor built in a sampling circuit by sampling a signal which is subjected to digital conversion in the sampling circuit (see, for example, Patent Document 1). The sampling mixer disclosed in Patent Document 1 will be described below with reference to the drawings.

FIG. 9 is a circuit diagram of sampling mixer 900 disclosed in Patent Document 1.

In FIG. 9, sampling mixer 900 has: TA (transconductance amplifier) 1 that converts the received radio frequency (RF) signal into RF current $i_{RF}$; in-phase sampling mixer (hereinafter "in-phase mixer") 2 that samples RF current $i_{RF}$ converted by TA 1; reverse phase sampling mixer (hereinafter "reverse phase mixer") 3 that is connected in parallel with in-phase sampling mixer 2; and DCU (digital control unit) 4 that generates control signals for in-phase mixer 2 and reverse phase mixer 3.

In-phase mixer 2 has sampling switch 5 composed of an FET, and Ch (history capacitor) 6 that continues integrating in the time domain the signal sampled based on an LO signal (i.e. local oscillation signal) by this sampling switch 5. Further, in-phase mixer 2 has a plurality of Cr (rotate capacitor) 7, 8, 9, 10, 11, 12, 13 and 14 that repeat integration and release of the signal sampled in sampling switch 5 and Cb (buffer capacitor) 15 that buffers signals released from rotate capacitors 7 to 14.

Further, in-phase mixer 2 has dump switch 16 for releasing the signals held in Cr 7 to 14 to Cb 15, reset switch 17 for resetting signals held in Cr 7 to 14 after signal release and a plurality of integration switches 18, 19, 20, 21, 22, 23, 24 and 25 for sequentially connecting Ch 6 with Cr 7 to 14. Furthermore, in-phase mixer 2 has a plurality of release switches 26, 27, 28, 29, 30, 31, 32 and 33 for sequentially connecting Cr 7 to 14 to Cb 15 and feedback switch 34 that controls an input of a feedback signal from a DA (digital-to-analogue) converter to sampling mixer 900.

Dump switch 16, reset switch 17, integration switches 18 to 25, release switches 26 to 33 and feedback switch 34 are each composed of an n-type FET. The n-type FET is turned on when the gate voltage shows the high level and is turned off when the gate voltage shows the low level. Further, reverse phase mixer 3 is composed in the same way as in-phase mixer 2.

DCU 4 is connected to the gates of integration switches 18 to 25, release switches 26 to 33, dump switch 16, reset switch 17 and feedback switch 34. DCU 4 outputs various control signals to the gates of these switches 16 to 34.

Types of control signals include the SV0 signal to SV7 signal, SAZ signal, SBZ signal, D signal, R signal and F signal. The SV0 signal to SV7signal operate as the gate signals for applicable integration switches 18 to 25. The SAZ signal operates as the gate signal for release switches 30 to 33 and the SBZ signal operates as the gate signal for release switches 26 to 29.

The D signal operates as the gate signal for dump switch 16 and the R signal operates as the gate signal for reset switch 17. The F signal operates as the gate signal for feedback switch 34.

FIG. 10 shows a timing chart of the control signals generated in DCU 4.

As shown in FIG. 10, the LO signal is a periodic rectangular pulse, and, when the LO signal rises after a predetermined cycle, the SV0 signal to SV7 signal repeat rising and falling alternately.

Then, when the SV0 signal and the SV4 signal rise, the states of the SAZ signal and the SBZ signal are inverted.

The D signal rises when the SV0 signal and SV4 signal rise. On the other hand, the D signal falls when the SV1 signal and SV5 signal fall.

The R signal rises when the D signal falls. Further, the F signal rises when the R signal falls.

Next, referring to the timings of the above control signals, the operation of sampling mixer 900 will be described. The operation of in-phase mixer 2 will be described in detail as an example.

First, TA 1 converts the RF signal into RF current $i_{RF}$ and supplies this RF current $i_{RF}$ to in-phase sampling mixer 2. Then, in-phase mixer 2 samples supplied RF current $i_{RF}$ using the LO signal. The LO signal has virtually the same frequency as RF current $i_{RF}$. As a result, RF current $i_{RF}$ is discretized in the time domain, and produces discrete signals.

Then, the discrete signals are integrated in Ch and Cr 7 to 14 and filtered and decimated (i.e. decimation). To be more specific, first, the SV0 signal is inputted to the gate of integration switch 18, integration switch 18 is turned on while the SV0 signal shows the high level and Ch 6 is connected to Cr 7. Then, discrete signals are held in Ch 6 and Cr 7. In this case, Cr 7 integrates the discrete signal while the SV0 signal shows the high level (for example, during eight cycles of the LO signal).

Next, when the SV0 signal showing the high level falls, the SV1 signal rises at the same time. Then, integration switch 18 is turned off and integration switch 19 is turned on. As a result, Cr 7 is disconnected from Ch 6 and Cr 8 is connected to Ch 6. Then, Ch 6 and Cr 8 hold discrete signals, and Cr 8 integrates the discrete signal while the SV1 signal shows the high level (for example, during eight cycles of the LO signal).

When the SV2 signal to SV7 signal are sequentially inputted to the gates of integration switches 20 to 25, integration switches 20 to 25 are turned on while the SV2 signal to SV7 signal show the high level (for example, during eight cycles of the LO signal). Then, Cr 9 to 14 are sequentially connected to Ch 6, and Cr 9 to 14 integrate discrete signals during, for example, eight cycles of the LO signal.

By so doing, it is possible to produce an effect of an eight-tap FIR (Finite Impulse Response) filter. The sampling rate in this case is decimated to a one-eighth, because signals matching eight cycles of the LO signal are moved, held in eight integration switches 18 to 25 and averaged. A filter configured this way will be referred to as "first step FIR filter." The Z transform of the transfer function of the first step FIR filter is represented by the following equation.

(Equation 1)

$$H_{FIR1} = \frac{1-z^{-8}}{1-z^{-1}} \quad [1]$$

Further, Ch 6 sequentially connected with Cr 7 to 14 holds the output potential, so that it is possible to produce an effect of an IIR (Infinite Impulse Response) filter. A filter configured this way will be referred to as "first step IIR filter." The Z transform of the transfer function of the first step IIR filter is represented by the following equation. However, the capacity of Ch 6 is Ch and the capacities of Cr 7 to 14 are Cr.

(Equation 2)

$$H_{IIR1} = \frac{1}{Ch + Cr - Ch z^{-1}} \quad [2]$$

Further, assuming that the LO signal frequency is fc and Ch is significantly greater than Cr, the cutoff frequency in the first step IIR filter can be determined by the approximation to the following equation.

(Equation 3)

$$fc_{IIR1} = \frac{f_{LO}}{16\pi} \frac{Cr}{Ch + Cr} \quad [3]$$

According to this equation 3, the cutoff frequency can be determined if the ratio of the capacity of Ch 6 to the capacities of Cr 7 to 14 is given. Further, to decrease the cutoff frequency, only Ch needs to be made greater than Cr.

Further, when the above-described SBZ signal is inputted to gates of release switches 26 to 29, all release switches 26 to 29 are turned on while the SBZ signal shows the high level. Then, the discrete signals integrated in Cr 7 to 10 are released to Cb 15 at the same time through release switches 26 to 39 that are turned on.

After this release, next, the D signal shows the low level, dump switch 16 is turned off and Cb 15 is disconnected from Cr 7 to 10.

Next, the R signal shows the high level, reset switch 17 is turned on and signals held in Cr 7 to 10 are reset.

By so doing, signals integrated in Cr 7 to 10 are released to Cb 15 at the same time, so that it is possible to produce an effect of a four-tap FIR filter. The sampling rate in this case is decimated to a one-fourth, because signals integrated by four Cr 7 to 10 is moved and averaged by Cb 15.

Further, signals integrated by Cr 11 to 14 function similar to the case of Cr 7 to 10 and are released to Cb 15 at the same time while the SAZ signal shows the high level. Consequently, it is possible to produce an effect of a four-tap FIR filter. Further, the sampling rate is decimated to a one-fourth. A filter configured this way will be referred to as "second step filter." The Z transform of the transform function of the second step FIR filter is represented by the following equation.

(Equation 4)

$$H_{FIR2} = \frac{1}{4} \frac{1 - z^{-4}}{1 - z^{-1}} \quad [4]$$

Further, when the SBZ signal shows the high level and the SAZ signal shows the low level, if the R signal is inputted to the gate of reset switch 17 and reset switch 17 is turned on, signals held in four Cr 7 to 10 are released to the ground terminal of Cr 7 to 10 and reset. On the other hand, when the SAZ signal shows the high level and the SBZ signal shows the low level, if the R signal is inputted to the gate of reset switch 17 and reset switch 17 is turned on, signals held in four Cr 11 to 14 are released to the ground terminal of Cr 11 to 14 and are reset.

Then, when the F signal is inputted to the gate of feedback switch 34 and feedback switch 34 is turned on, a feedback signal is inputted to sampling mixer 900 from a signal processor through a DA converter (not shown). The feedback signal refers to a signal for compensating for the DC offset or differential offset, and is generated in the signal processor (not shown). To be more specific, the signal processor receives as input the output signal of sampling mixer 900 through the AD converter. Then, the signal processor generates the above-described feedback signal based on this output signal. By this means, the DC offset and differential offset are compensated for. Thanks to the feedback signal in this case, the DC offset and differential offset are compensated for upon the operation of the first step IIR filter.

Further, four Cr are connected to Cb 15 in the above-described unit of a group of four Cr 7 to 10 or a group of four Cr 11 to 14. By this means, it is possible to produce an effect of an IIR filter. A filter configured this way will be referred to as "second step IIR filter." The Z transform of the transfer function of the second step IIR filter can be represented by the following equation.

(Equation 5)

$$H_{IIR2} = \frac{Cr}{Cb + Cr - Cb z^{-1}} \quad [5]$$

Further, if Cb is significantly greater than Cr, the cutoff frequency in the second IIR filter can be determined by the approximation to the following equation.

(Equation 6)

$$fc_{IIR2} = \frac{f_{LO}}{16\pi} \frac{4Cr}{Cb + 4Cr} \quad [6]$$

According to equation 6, the cutoff frequency can be determined if the ratio of the capacity of Cb 15 to the capacities of Cr 7 to 14 is given.

Further, the Z transform of the transfer function of the filters of entire in-phase sampling mixer 2 from equation 1, equation 2, equation 4 and equation 5, is represented by the following equation.

(Equation 7)

$$H = H_{FIR1} H_{IIR1} H_{FIR2} H_{IIR2} \quad [7]$$
$$= \frac{1 - z^{-8}}{1 - z^{-1}} \frac{1}{(C_H + C_R) - C_H z^{-8}} \frac{1}{4} \frac{1 - z^{-32}}{1 - z^{-8}}$$
$$\frac{4C_R}{(4C_R + C_B) - C_B z^{-32}}$$

The DC gain after frequency conversion of this H can be determined by the following equation.

(Equation 8)

$$G_{DC} = \frac{8}{Cr} \quad [8]$$

According to equation 8, the DC gain can be determined if the number of decimations in the first FIR filter, eight, and the capacities of Cr 7 to 14 are given.

Further, reverse phase mixer 3 operates in virtually the same way as in-phase mixer 2 except the following.

That is, the LOB signal operating as the gate signal for sampling switch 35 of reverse phase mixer 3 has 180 degrees of a phase delay from the LO signal, and the sampling timing in reverse phase mixer 3 delays by half of the cycle, from the timing in in-phase mixer 2.

If sampling mixer 900 is configured this way, the output signal of sampling mixer 900 becomes a signal that has passed through the first step FIR filter, first step IIR filter, second step FIR filter and second step IIR filter.

Patent Document 1: Japanese Patent Application Laid-Open No. 2004-289793 (page 6 to 9, FIG. 3a, FIG. 3b and FIG. 4)

DISCLOSURE OF INVENTION

Problems to be Solved by the Invention

However, in the sampling mixer disclosed in Patent Document 1, when the number of decimations in the first step FIR filter, the cutoff frequency in two IIR filters (first step and second step) and the condition of designing the DC gain are designated, the overall electrostatic capacity (the total sum of capacity values of Ch, Cr and Cb) of the sampling mixer is determined and, as a result, there is a problem that the flexibility of design including DC gain is little.

To be more specific, for example, when the number of decimations in the first step FIR filter is designated, the sampling rate in the AD converter connected next to the sampling mixer based on the number of Cr connected to Ch is obtained.

Further, when the cutoff frequency is designated, ratios of capacities of Ch, Cr and Cb are determined from equation 3 and equation 6.

Further, when the number of decimations in the first step FIR filter and the DC gain are designated, the capacity of Cr is determined from equation 8. As a result, the capacities of Ch and Cb are determined based on ratios of the capacity of Cr to the capacities of above-described Ch, Cr and Cb and the total sum of capacity values of Ch, Cr and Cb is determined.

As described above, it is difficult to decrease the total sum of capacity values of Ch, Cr and Cb while maintaining the number of decimations in the first step filter, the cutoff frequency in the IIR filter and the DC gain.

It is therefore an object of the present invention to provide a discrete filter, sampling mixer and radio apparatus that make it possible to improve the flexibility of design, including DC gain.

Means for Solving the Problem

The discrete filter according to the present invention includes: a control signal generator that generates a plurality of control signals of a same frequency and varying phases; a history capacitor that integrates a received signal; a capacitor group comprised of m rotate capacitors (where m is a natural number of two or greater) that are sequentially connected in parallel with the history capacitor and integrate the received signal; and a buffer capacitor that integrates a signal released from the capacitor group, and employs a configuration in which: the m rotate capacitors forming the capacitor group integrate the received signal at respective timings based on the plurality of control signals; and the plurality of m rotate capacitors are divided into a plurality of groups based on timings at which the integrated received signal is released, and release the integrated received signal to the buffer capacitor such that at least part of a period in which the received signal is integrated in rotator capacitors forming one group selected from the plurality of groups and a period in which a received signal integrated in a period prior to the part of the period, is released from rotate capacitors forming other groups than the selected one group, overlap in the time domain, and the discrete filter comprises a capacity adjusting section that is connected in parallel with the capacitor group and the buffer capacitor and that adjusts an amount of integration of the signal released from the capacitor group and integrated in the buffer capacitor.

Advantageous Effect of the Invention

According to the present invention, when an IIR filter composed of a history capacitor and rotate capacitor operates, integration elements after resetting are connected to the history capacitor, so that it is possible to improve the flexibility of design, including DC gain.

When an IIR filter composed of a rotate capacitor and buffer capacitor operates, integration elements after resetting are connected to the buffer capacitor, so that it is possible to improve the flexibility of design, including DC gain.

BEST MODE FOR CARRYING OUT THE INVENTION

Figure 1:
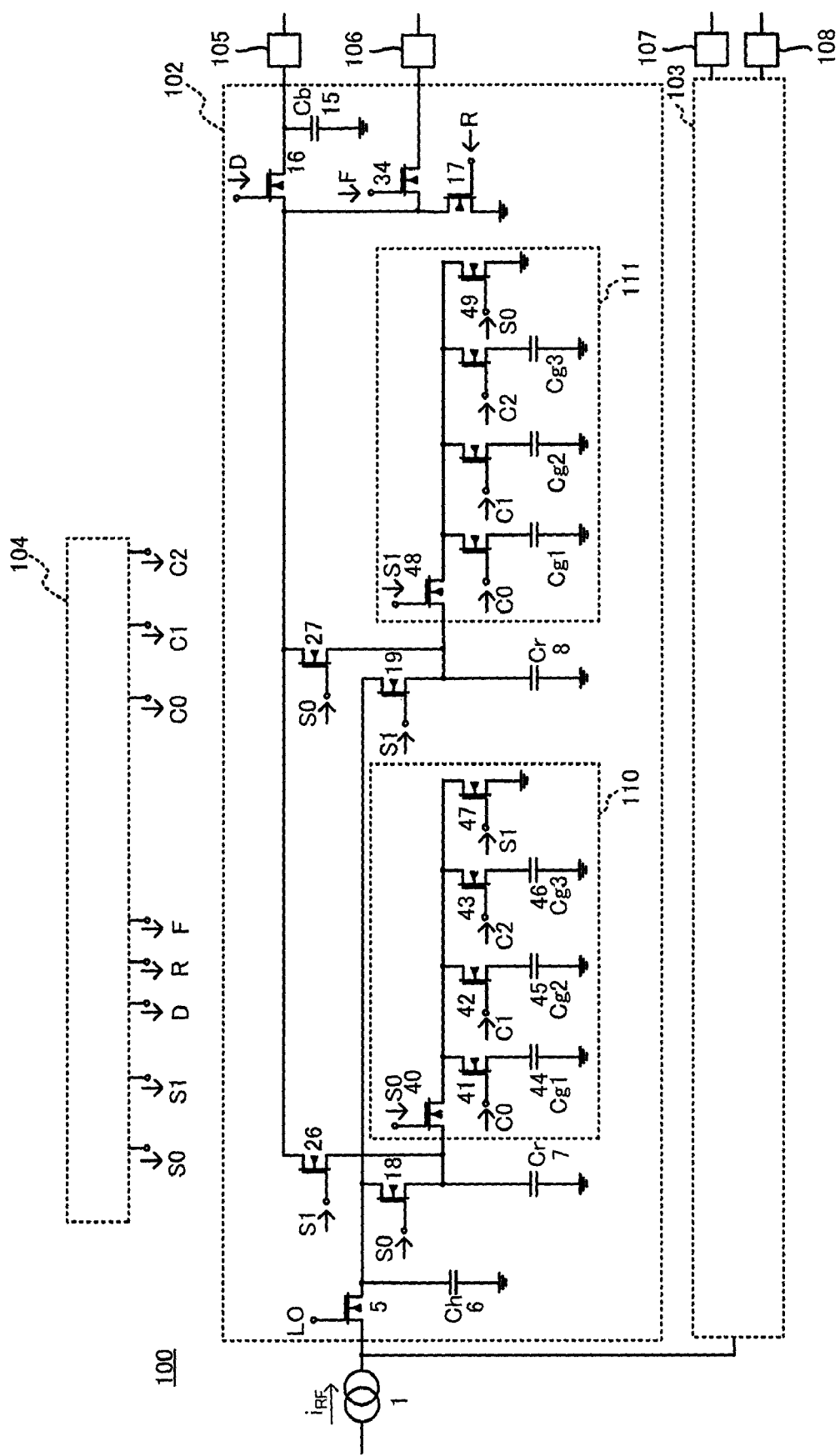
FIG. 1 shows an example of a sampling mixer circuit according to Embodiment 1 of the present invention.

Embodiments 1 to 6 according to the present invention will be described with reference to the drawings. Further, the embodiments will be described by assigning the same reference numerals (terms) to the same parts.

Embodiment 1

FIG. 1 shows an example of a sampling mixer circuit according to Embodiment 1 of the present invention. In FIG. 1, sampling mixer 100 has: TA (transconductance amplifier) 1; in-phase mixer 102 connected to TA 1; reverse phase mixer 103 connected in parallel to in-phase mixer 102; and control signal generator (signal generator) 104 that generates control signals to in-phase mixer 102 and reverse phase mixer 103.

TA 1 converts a received radio frequency (RF) signal into RF current $i_{RF}$ and supplies RF current $i_{RF}$ to in-phase mixer 102 and reverse phase mixer 103.

In-phase mixer 102 has sampling switch 5, Ch (history capacitor, also referred to as "first capacitor") 6, two Cr (rotator capacitors, also referred to as "second capacitors") 7 and 8, Cb (buffer capacitor, also referred to as "third capacitor") 15 and dump switch 16. Further, for ease of description, although a case will be described where the number of rotate capacitors arranged in parallel is two, the number of rotator capacitors may be three or more.

Further, in-phase mixer 102 has reset switch 17, two integration switches 18 and 19, two release switches 26 and 27, feedback switch 34 and two gain control capacity sections (adjusting section) 110 and 111. With the present embodiment, one gain control capacity section (adjusting section) is connected in parallel to each rotate capacitor. Further, with the present embodiment, a plurality of above-described various switches 5, 16, 26, 27 and 34 are composed of, for example, n-type FET's.

To be more specific, in in-phase mixer 102, the source of sampling switch 5 is connected to the output port of TA 1 and the drain of sampling switch 5 is connected to the drain of integration switch 19. Further, one port of Ch 6 is connected between the drain of sampling switch 5 and the drain of integration switch 19, and the other port of Ch 6 is grounded.

Furthermore, a circuit composed of integration switch 18 and Cr 7 is connected in parallel to Ch 6 between the drain of sampling switch 5 and the drain of integration switch 19.

Gain control capacity section 110 is connected between the source of integration switch 18 and one port of Cr 7.

Gain control capacity section 110 is configured to include gain control switch 40, three switching switches 41, 42 and 43, three gain control capacitors (integration elements) 44, 45 and 46, and reset switch 47. With the present embodiment, the capacities of three gain control capacitors are represented by Cg 1, Cg 2 and Cg 3. A plurality of above-described various switches 40, 41 to 43 and 47 are composed of, for example, n-type FET's.

In gain control capacity section 110, the source of gain control switch 40 is connected in common to the source of integration switch 18 and one port of Cr 7. Further, a circuit composed of switching switch 41 and gain control capacitor 44 is connected to the drain of gain control switch 40. One port of gain control capacitor 44 is connected to the source of switching switch 41 and the other port of gain control capacitor 44 is grounded.

Further, a circuit composed of switching switch 42 and gain control capacitor 45 and a circuit composed of switching switch 43 and gain control capacitor 46 are connected in parallel to the drain of gain control switch 40. Furthermore, the other ports of gain control capacitors 45 and 46 are grounded.

The drain of reset switch 47 is connected to the drain of gain control switch 40, and the source of reset switch 47 is grounded.

The source of release switch 26 is connected in common to the connecting point of gain control switch 40 between one port of Cr 7 and the source of integration switch 18 and to the source of gain control switch 40, and the drain of release switch 26 is connected to AD (analogue-to-digital) converter 105 through dump switch 16.

The drain of release switch 27 is connected between the drain of release switch 26 and the source of dump switch 16. Further, the source of release switch 27 is connected in common to one port of Cr 8 and the source of integration switch 19.

One port of Cr 8 is connected to the source of integration switch 19 and the other port of Cr 8 is grounded.

Further, gain control capacity section 111 is connected between the source of integration switch 19 and one port of Cr 8.

Gain control capacity section 111 is configured to include gain control switch 48 and reset switch 49. The source of gain control switch 48 is connected in common to the source of integration switch 19 and one port of Cr 8 and the drain of gain control switch 48 is connected to the drain of reset switch 49. Further, the source of reset switch 49 is grounded.

The other configuration of gain control capacity section 111 is the same as gain control capacity section 110 and repetition of description will omitted.

Further, the drain of reset switch 17 is connected between the drain of release switch 26 and the source of dump switch 16 and the source of reset switch 17 is grounded. Furthermore, the source of reset switch 34 is connected to the drain of reset switch 17 and the drain of reset switch 34 is connected to DA converter 106.

The configuration in reverse phase mixer 103 is not shown and nevertheless is configured in the same way as in-phase mixer 102.

Control signal generator 104 is composed of, for example, shift registers and generates various control signals based on a one-eighth of an LO signal (i.e. local oscillation signal).

Types of control signals include S0 to S1 signals, a D signal, R signal, F signal and C0 to C2 signals. S0 and S1 signals have the same frequency and varying phases. The S0 signal operates as a gate signal for integration switch 18, release switch 27, gain control switch 40 and reset switch 49. The S1 signal operates as a gate signal for integration switch 19, release switch 26, gain control switch 48 and reset switch 47. Further, given that a case is being described with the present embodiment where two rotate capacitors 7 and 8 are arranged in parallel, two control signals S0 and S1 are generated.

The D signal operates as a gate signal for dump switch 16, and the R signal operates as a gate signal for reset switch 17. Further, the F signal operates as a gate signal for feedback switch 34.

The C0 signal operates as a gate signal for switching switch 41. The C1 signal operates as a gate signal for switching switch 42. The C2 signal operates as a gate signal for switching switch 43.

Based on the C0 to C2 signals, switching switches 41 to 43 are turned on and off based on whether the C0 to C2 signals show the high or low level. Then, capacities of gain control capacitors 44 to 46 (the total capacity of gain control capacity section 110) varies depending on whether switching switches 41 to 43 are turned on or off. That is, the combinations of gain control capacitors of a plurality of gain control capacitors 44 to 46 included in gain control capacity section 110, which are connected with Ch 6 and Cr 7, are changed by controlling the switching switches on and off, so that it is possible to make variable an effective capacity value of gain control capacity section 110. The C0 to C2 signals are not control signals that have cycles matching the LO signal but are control signals that carry out control such that a gain adequate for the reception condition can be obtained. The degree of variation in the total capacity of gain control capacity section 110 that can be changed by this control of these control signals is as follows. For example, assuming that the total capacity of gain control capacity section 110 is Cg, Cg discretely varies in the range between zero and (Cg1+Cg2+Cg3).

Figure 7:
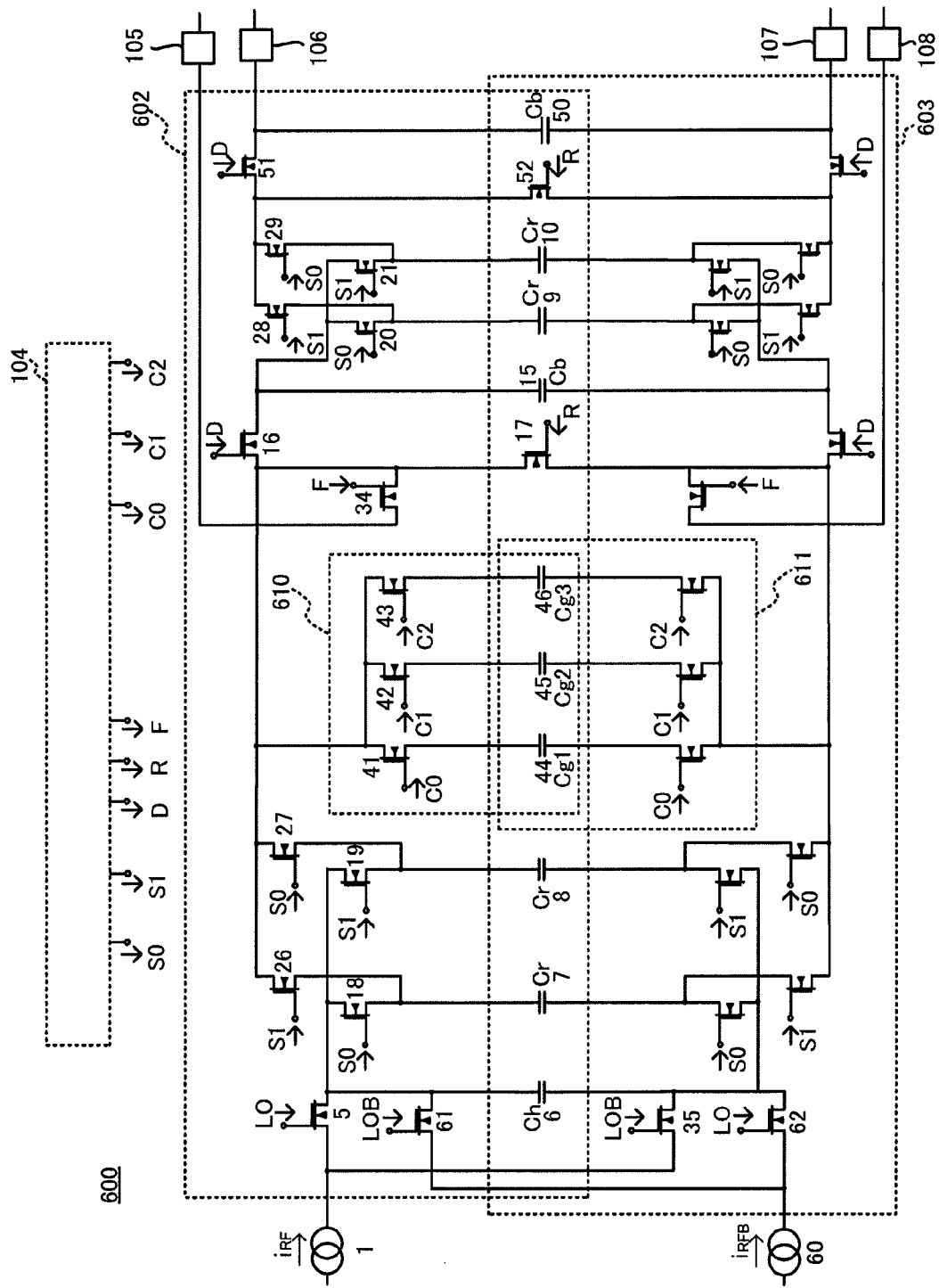
FIG. 7 shows an example of the sampling mixer circuit according to Embodiment 6 of the present invention.

FIG. 7 is a timing chart of control signals generated in control signal generator 104. According to FIG. 2, the S0 signal and S1 signal are each shifted half a cycle to produce pulses. With the present embodiment, the period the S0 signal and S1 signal shows the high level matches eight cycles of the LO signal but may be changed.

When the S0 signal and S1 signal rise, the D signal rises and, next, when the D signal falls, the R signal rises. Further, when the R signal falls, the F signal rises.

Next, referring to timings of control signals such as the above-described S0 signal, the operation of sampling mixer 100 will be described. The operation of in-phase mixer 102 will be described here in detail as an example.

First, TA 1 converts the RF signal into RF current $i_{RF}$ and supplies this RF current $i_{RF}$ to sampling switch 5 of in-phase mixer 102. Then, supplied RF current $i_{RF}$ is sampled based on the LO signal inputted to the gate of sampling switch 5. The LO signal has virtually the same frequency as RF current $i_{RF}$. As a result, RF current $i_{RF}$ is discretized in the time domain, and produces discrete signals.

Next, the S0 signal is inputted to the gates of integration switch 18, release switch 27, gain control switch 40 and reset switch 49, these switches 18, 27, 40 and 49 are turned on while the S0 signal shows the high level.

Then, the above-described discrete signals (matching eight cycles of the LO signal) are integrated in Ch 6, Cr 7 and gain control capacitors 44 to 46 of gain control capacity section 110. To be more specific, the discrete signals flow to Ch 6 and are integrated in Ch 6. Further, the discrete signals flow to Cr 7 and gain control capacity section 110 through integration switch 18 that is turned on, and are integrated in Cr 7 and gain control capacity section 110. The portion of discrete signals flow to gain control capacity section 110 in this way, so that it is possible to adjust the amount of integration of discrete signals to be integrated in Ch 6 and Cr 7. Further, as described above, the combinations of capacitors of a plurality of capacitors included in gain control capacity section 110, which are connected with Ch 6 and Cr 7, are changed by controlling the switching switches on and off, so that it is possible to change an effective capacity of gain control capacity section 110. By this means, it is possible to gradually adjust the amount of integration of discrete signals integrated in Ch 6 and Cr 7.

Further, signals held in gain control capacitors of gain control capacity section 111 are reset when reset switch 49 is turned on. Furthermore, during the period the S0 signal shows the high level, that is, the period integration is carried out in Cr 7, switch 27 is turned on. Consequently, signals held in Cr 8 are released to Cb 15. That is, the integration period of Cr 7 and the release period of Cr 8 overlap in time.

When the S0 signal showing the high level falls, the S1 signal rises at the same time, integration switch 18, release switch 27 and reset switch 49 are turned off. Further, integration switch 19, release switch 26 and reset switch 47 are turned on. Then, Cr 7 is disconnected from Ch 6 and Cr 8 is connected to Ch 6. Consequently, the above-described discrete signals (matching eight cycles of the LO signal) are integrated in Ch 6, Cr 8 and gain control capacitors of gain controller 111. To be more specific, the discrete signals flow to Ch 6 and are integrated in Ch 6. Further, the discrete signals flow to Cr 8 and gain control capacity section 111 through integration switch 19 that is turned on, and are integrated in Cr 8 and gain control capacity section 111.

Furthermore, signals held in gain control capacitors 44 to 46 are reset when reset switch 47 is turned on.

Every time the S0 signal and S1 signal alternately show the high level, discrete signals repeat being integrated, as described above. As a result, discrete signals matching eight cycles of the LO signal are integrated, so that it is possible to produce an effect of an FIR filter. The sampling rate is decimated to a one-eighth.

Further, Ch 6 to which Cr 7 and 8 are alternately connected holds the output potential. By this means, it is possible to produce an effect of a first step IIR filter. When Ch 6 and Cr 7 are connected, gain control capacity section 110 after resetting is connected. When Ch 6 and Cr 8 are connected, gain control capacity section 111 after resetting is connected.

Figure 2:
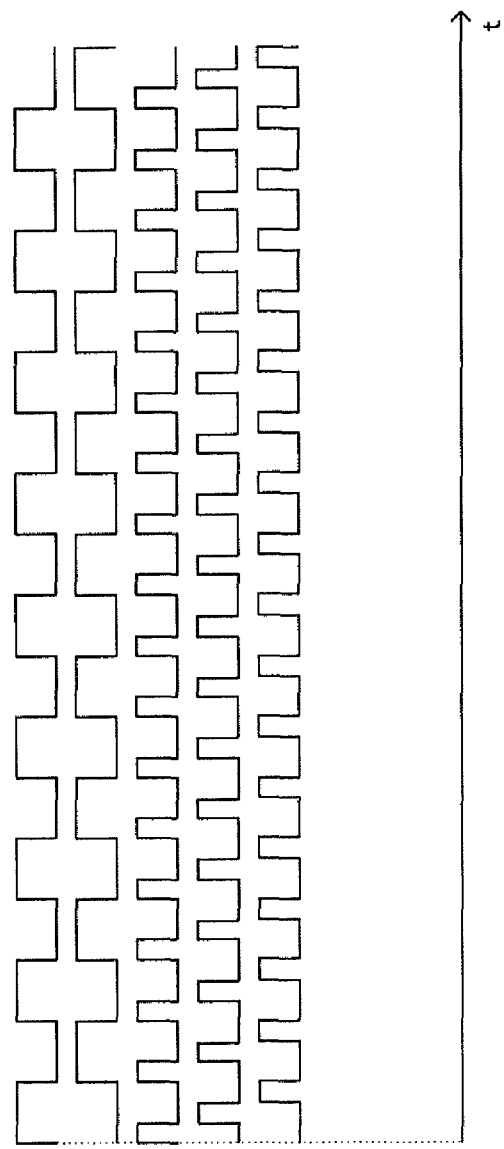
FIG. 2 is a timing chart of control signals generated in a control signal generator of FIG. 1.

Further, as shown in FIG. 2, if the D signal also rises when the S0 signal rises, dump switch 16 is turned on and Cb 15 is connected to Cr 8 through release switch 27. Then, signals held in Cr 8 are released to Cb 15 through dump switch 16 that is turned on. Further, the signals held in Cr 8 are outputted to a DSP (not shown) through dump switch 16 that is turned on and AD converter 105. By this means, the DSP generates a feedback signal for compensating for the DC offset and differential offset.

If the R signal rises at a timing the D signal falls, dump switch 16 is turned off and reset switch 17 is turned on. Then, the signals held in Cr 8 are reset.

Next, if the F signal rises at a timing the R signal falls, reset switch 17 is turned off and feedback switch 34 is turned on. Then, the above-described feedback signal from the DSP is inputted to in-phase mixer 102 through DA converter 106. By this means, the DC offset and differential offset are compensated for.

On the other hand, if the D signal also rises at a timing the S1 signal rises, dump switch 16 is turned on. By this means, Cb 15 is connected to Cr 7 through release switch 26.

When Cb 15 and Cr 7 are connected, signals held in Cr 7 are outputted to Cb 15 through dump switch 16 that is turned on. Further, the signals held in Cr 7 are outputted to a DSP (not shown) through dump switch 16 that is turned on and AD converter 105. By this means, the DSP generates a feedback signal for compensating for the DC offset and differential offset.

The S0 signal and S1 signal alternately rise in this way, so that Cr 7 and Cr 8 are connected alternately to Cb 15. In this case, Cb 15 holds the output potential. By this means, it is possible to produce an effect of a second step IIR filter.

Then, if the R signal rises at a timing the D signal falls, dump switch 16 is turned off and reset switch 17 is turned on. That is, reset switch 17 is turned on after a predetermined period (corresponding to a timing the D signal falls) from a start timing (i.e. a timing the S0 signal or S1 signal rises) of each release period of the rotate capacitor. Then, signals held in Cr 8 are reset. Further, reset switch 17 is turned off before the start timing (i.e. the next timing the S0 signal or S1 signal rises) of the next release period.

Next, if the F signal rises at a timing the R signal falls, reset switch 17 is turned off and feedback switch 34 is turned on. Then, the above-described feedback signal from the DSP is inputted to in-phase mixer 102 through DA converter 106. By this means, the DC offset and differential offset are compensated for.

Assuming that the total capacity of gain control capacity sections 110 and 111 is Cg, the Z transform of the transfer function of the first step IIR filter is represented by the following equation.

(Equation 9)

$$H_{IIR1} = \frac{1}{Ch + Cr + Cg - Chz^{-1}} \quad [9]$$

Further, the DC gain of in-phase mixer 102 can be determined by the following equation.

(Equation 10)

$$G_{DC} = \frac{8}{Cr + Cg} \quad [10]$$

According to equation 10, even if the number of decimations in an FIR filter is not changed, the DC gain of in-phase mixer 102 can be determined by the ratio of the capacities Cr of Cr 7 and 8 to the total capacity Cg of gain control capacity sections 110 and 111. Consequently, it is possible to set the DC gain and capacities of Cr 7 and 8 to arbitrary values.

Further, assuming that the degree of switching of the DC gain is x[dB] where Cg=0, Cg can be determined by the following equation.

(Equation 11)

$$Cg = (10^{\frac{x}{20}} - 1)Cr \quad [11]$$

According to equation 11, Cg required to find the degree of switching of the DC gain can be determined by the ratio of Cg to Cr. For example, if the DC gain is decreased 2 dB from the condition of Cg=0, the relationship of Cg=0.26 needs to be met.

Further, with the present embodiment, as described above, Cg=(Cg1+Cg2+Cg3) can be made variable discretely by the C0 to C2 signals, so that the DC gain can be made variable according to equation 11.

For example, if the DC gain is switched at four levels of a step width of x=2 dB from the condition of Cg=0, the four levels need to be set such that the following condition is met. That is, assuming that Cg 1=0.26 Cr, Cg 2=0.32 Cr, and Cg 3=0.42 Cr, the DC gain is switched in order from Cg=0, Cg=0.26 Cr, Cg=0.58 Cr and Cg=1.0 Cr (at four levels).

Further, for example, if the DC gain is switched at four levels of a step width of x=1 dB from the condition of Cg=0, the four levels need to be set such that the following condition is met. That is, assuming that Cg 1=0.12 Cr, Cg 2=0.15 Cr, and Cg 3=0.17 Cr, the DC gain is switched in order from Cg=0, Cg=0.12 Cr, Cg=0.26 Cr, Cg=0.41 Cr and Cg=0.58 Cr (at four levels).

If the DC gain is switched at four levels in this way, the cutoff frequency in the first step IIR filter changes depending on the total capacity of gain control capacity sections 110 and 111 (see equation 3). Further, even if such a change is possible, the ratio of the capacity of Ch 6 to capacities Cr of Cr 7 and Cr 8 is decreased and the cutoff frequency in the first step IIR filter is set high. Furthermore, by setting the cutoff frequency in the second step IIR filter low, it is possible to suppress the degree of change. Consequently, it is possible to make the cutoff frequency virtually a constant value.

Further, according to equations 9 to 11, the total sum of capacity values is compared between the sampling mixer of the present invention and a conventional sampling mixer that does not use a gain control capacity section. For example, capacities Ch and Cb are significantly greater than Cr and Ch=10 Cr, the total sum of capacity values of the part of the first step IIR filter configuration of a conventional sampling mixer is Ch+Cr=11 Cr. Next, a sampling mixer that uses the gain control capacity section makes the capacities of Ch and Cr, for example, half. Although the DC gain increases 6 dB because Cr is made half, it is possible to decrease the DC gain 6 dB and adjust the DC gain to a value before Cr is made half, by connecting Cg having the same capacity value as Cr that is made half. The total sum of capacity values of a part of the first step IIR filter configuration in this case is 6 Cr. Consequently, if the gain control capacity section is used, it is possible to decrease the total sum of capacity values while maintaining the DC gain.

As described above, it is possible to improve flexibility of the total capacity value of the sampling mixer, DC gain, the cutoff frequency of filter characteristics. Further, gain control is possible by switching the capacity value of the gain control capacity section.

Further, although an element forming a switch is composed of an n-type FET with the present embodiment, the element may be composed of a p-type FET or combination of n-type and p-type FET's. In this case, the source terminal and the drain terminal may be switched. Further, the micro elector mechanical system (MEMS) may also be used.

Further, although the number of Cr connected to Cb at a given time is one, the present invention is not limited to this.

Furthermore, although, with the present embodiment, the number of gain control capacitors in the gain control capacity section is three, the present invention is not limited to this. The gain may not be made variable using one gain control capacitor without using capacity switching switches.

Although, with the present embodiment, the gain control switch controls connection between Cr and the gain control capacity section and switching switches control the capacity value of the gain control capacity section, a signal for controlling connection between Cr and the gain control capacity section, may be supplied to switching switches without using the gain control switch.

Further, although, with the present embodiment, a reset switch for resetting signals integrated in gain control capacitors, a control signal for controlling connection between the gain control capacity section and Cr when Cr is reset, may be supplied to the gain control switch without providing the reset switch. Further, a control signal for controlling connection between the gain control capacity section and Cr when Cr is reset, may be supplied to switching switches without providing the gain control switch.

Further, although, with the present embodiment, the gain control capacity section is connected between Cr and the integration switch, the gain control capacity section may be connected between Ch and the integration switch.

Further, although, with the present embodiment, a sampling mixer connected with a sampling switch has been described, a discrete time processing filter which receives as input a BB signal may be possible without using a sampling switch. The BB signal is a received signal which is subjected to frequency conversion from the RF frequency band to the BB frequency band, and may be a continuous signal or discrete signal.

Embodiment 2

Figure 3:
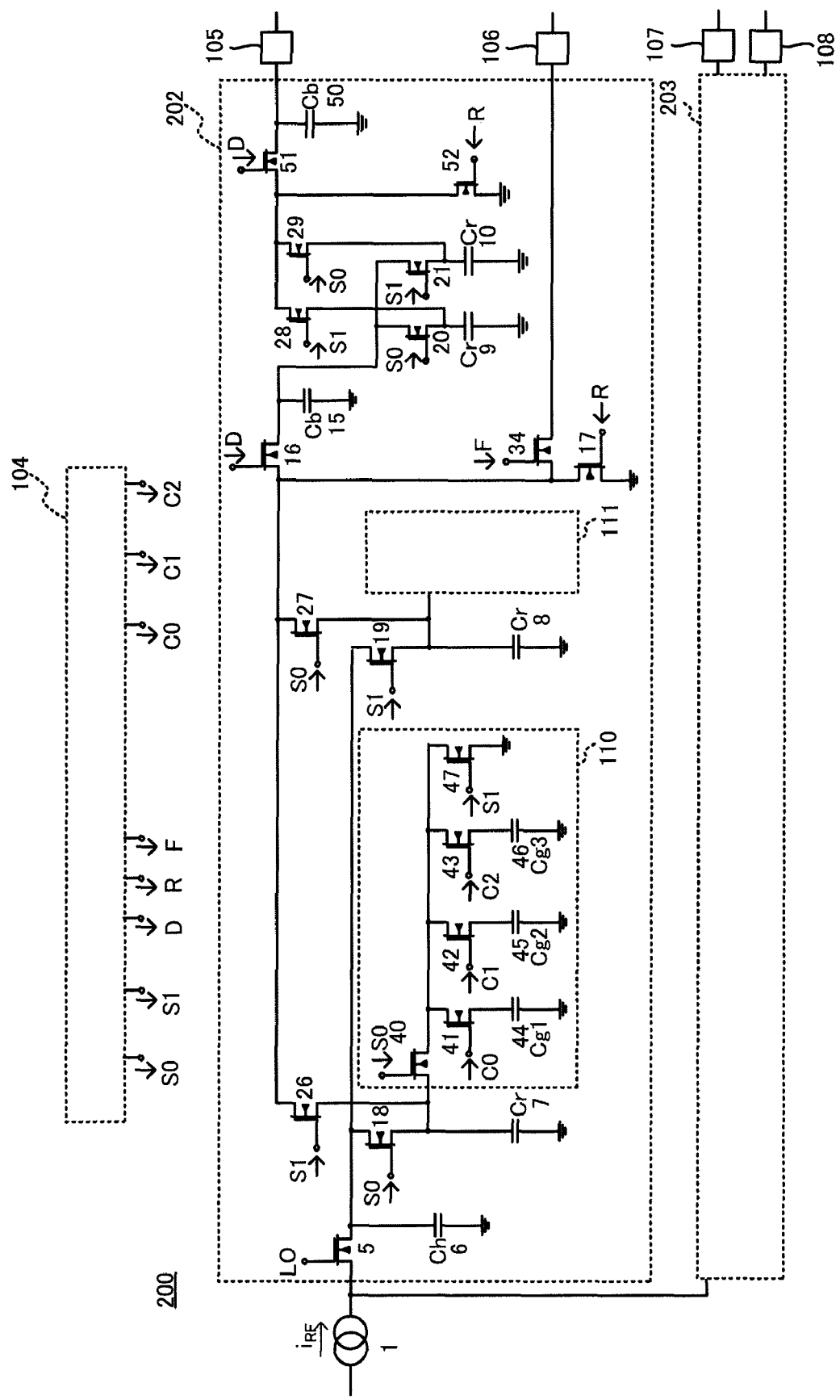
FIG. 3 shows an example of the sampling mixer circuit according to Embodiment 2 of the present invention.

FIG. 3 shows an example of a circuit of sampling mixer 200 according to Embodiment 2 of the present invention. Differences between the present embodiment and Embodiment 1 will be mainly described here.

Sampling mixer 200 is configured to include in-phase mixer 202 and reverse phase mixer 203 instead of in-phase mixer 102 and reverse phase mixer 103 of FIG. 1.

In in-phase mixer 202, the drain of integration switch 21 is further connected to the drain of dump switch 16 of FIG. 1, and one port of Cr 10 is connected to the source of integration switch 21. The other port of Cr 10 is grounded.

Further, the drain of integration switch 20 is connected between the drain of dump switch 16 and the drain of integration switch 21 and one port of Cr 9 is connected to the source of integration switch 21. The other port of Cr 9 is grounded.

Further, the source of release switch 28 is connected between one port of Cr 9 and the source of integration switch 20, and the drain of release switch 28 is connected to the source of dump switch 51.

Further, the drain of release switch 29 is connected between the drain of release switch 28 and the source of dump switch 51. On the other hand, the source of release switch 29 is connected between the source of integration switch 21 and one port of Cr 10.

Further, the drain of reset switch 52 is connected between the drain of release switch 28 and the source of dump switch 51, and the source of reset switch 52 is grounded.

Further, one port of Cb 50 is connected between the drain of dump switch 51 and AD converter 105, and the other port of Cb 50 is grounded.

The gates of integration switch 20 and release switch 29 and the gates of integration switch 21 and release switch 28 are configured to receive as input the S0 signal from control signal generator 104 and the S1 signal from control signal generator 104, respectively.

Further, the gate of dump switch 51 and the gate of reset switch 52 are configured to receive as input the D signal from control signal generator 104 and the R signal from control signal generator 104, respectively.

Further, reverse phase mixer 203 is configured in the same way as in-phase mixer 202 except that reverse phase mixer 203 operates in the reverse phase. The other configuration of sampling mixer 200 is configured in the same way as in Embodiment 1.

By configuring sampling mixer 200 this way, Cr 7 and 8 are alternately connected to Cb 15, so that it is possible to produce an effect of a second step IIR filter. Further, Cr 9 and 10 are alternately connected to Cb 15, so that it is possible to produce an effect of a third step IIR filter.

To be more specific, as shown in FIG. 2, if the D signal also rises at a timing the S0 signal rises, two dump switches 16 and 51 are turned on. Then, Cb 15 is connected to Cr 8 through release switch 27, and signals held in Cr 8 are released to Cb 15 through dump switch 16 that is turned on. The present embodiment is the same as Embodiment 1 in this regard.

With the present embodiment, when the S0 signal shows the high level, dump switch 51 is also turned on, so that the following operation is further carried out. That is, Cb 50 is connected to Cr 10 through release switch 29 that is turned on, and signals held in Cr 10 are released to Cb 50 through release switch 29 that is turned on and dump switch 51.

Similarly, when the S1 signal shows the high level, the D signal rises, and, if dump switch 51 is turned on, Cb 50 is connected to Cr 9 through release switch 28 that is turned on. By this means, signals held in Cr 9 are released to Cb 50 through release switch 28 that is turned on and dump switch 51.

By so doing, Cr 7 and 8 are connected alternately with Cb 15, so that Cb 15 holds the output potential. Consequently, it is possible to produce the above-described effect of a third step IIR filter.

As described above, sampling mixer 200 is able to produce a greater degree of attenuation compared to the case of Embodiment 1 thanks to the effect of a third IIR filter. By increasing the cutoff frequency in the first step IIR filter higher than the cutoff frequencies of the second step and third step IIR filters, it is possible to decrease the degree of change of filter characteristics when the DC gain is made variable.

Embodiment 3

Figure 4:
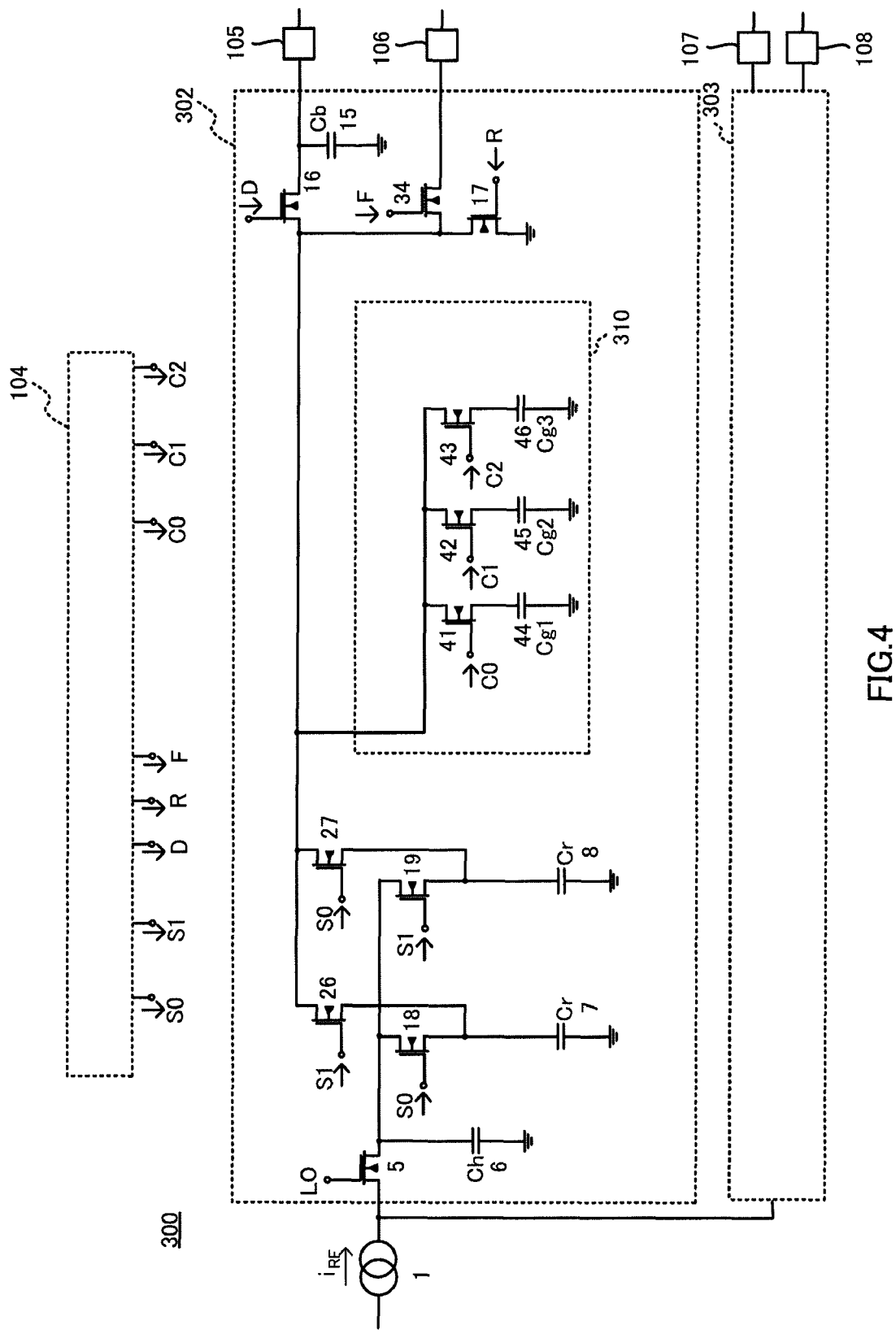
FIG. 4 shows an example of the sampling mixer circuit according to Embodiment 3 of the present invention.

FIG. 4 shows an example of a circuit of sampling mixer 300 according to Embodiment 3 of the present invention. Differences between the present embodiment and Embodiment 1 will be mainly described here.

Sampling mixer 300 is configured to include in-phase mixer 302 and reverse phase mixer 303 instead of in-phase mixer 102 and reverse phase mixer 103 of FIG. 1.

In-phase mixer 302 is configured to include one gain control capacity section 310 instead of two gain control capacity sections 110 and 111 of FIG. 1.

Gain control capacity section 310 has three circuits connected in parallel, that is, a circuit composed of switching switch 41 and gain control capacitor 44, a circuit composed of switching switch 42 and gain control capacitor 45 and a circuit composed of switching switch 43 and gain control capacitor 46. Further, switching switches 41 to 43 are composed of, for example, n-type FET's.

The drain of switching switch 43 is connected in common to release switch 27 and the source of dump switch 16.

The C0 signal from control signal generator 104, the C1 signal from control signal generator 104 and the C2 signal from control signal generator 104 are inputted to the gate of switching switch 41, the gate of switching switch 42 and the gate of switching switch 43, respectively.

The drain of release switch 26 is connected to the source of dump switch 16. Further, the drain of release switch 27 is connected prior to gain control capacity section 310 connected between the drain of release switch 26 and the source of dump switch 16.

The other configuration of sampling mixer 300 is configured in the same way as in Embodiment 1.

Next, referring to timings of the above control signals, the operation of sampling mixer 300 will be described. The operation of in-phase mixer 302 will be described here in detail as an example (see FIG. 2 and FIG. 4 appropriately).

As in the case of Embodiment 1, with Embodiment 3, discrete signals matching eight cycles of the LO signal are integrated in Ch 6 and Cr 7 by means of the S0 signal and, next, the discrete signals are integrated in Ch 6 and Cr 8 by means of the S1 signal. Such integration is repeated alternately when the S0 signal and the S1 signal are inputted, so that it is possible to produce an effect of an FIR filter. The sampling rate is decimated to one-eighth.

Further, Cr 7 and 8 are alternately connected to Ch 6 and Ch 6 holds the output potential. Consequently, it is possible to produce an effect of a first IIR filter.

Further, Cr 7 and 8 are connected alternately to Cb 15 by means of the S0 signal or S1 signal and Cb 15 holds the output potential. Consequently, it is possible to produce an effect of a second IIR filter. In this case, gain control capacitors 44 to 46 of gain control capacity section 310 integrate signals released from Cr 7 and 8.

To be more specific, when the S0 signal shows the high level, discrete signals integrated in Cr 8 are released to gain control capacitors 44 to 46 through release switch 27 that is turned on, and are integrated therein. On the other hand, when the S0 signal shows the high level, discrete signals integrated in Cr 7 are released to gain control capacitors 44 to 46 through release switch 26 that is turned on, and are integrated therein. A portion of discrete signals integrated in Cr 7 in this way flows to gain control capacity section 310, so that it is possible to adjust the amount of integration of discrete signals to be integrated in Cb 15. Further, the combinations of capacitors of a plurality of capacitors included in gain control capacity section 310, which are connected with Cb 15, are changed by controlling the switching switches on and off, so that it is possible to change an effective capacity of gain control capacity section 310. By this means, it is possible to adjust the amount of integration of discrete signals integrated in Cb 15 at gradually.

Then, when the R signal rises and shows the high level, reset switch 17 is turned on and signals held in gain control capacitors 41 to 43 flow to ground terminals and are reset. By so doing, when the second step IIR filter operates, gain control capacitors 44 to 46 reset the integrated signals and, then, integrate signals released from Cr 7 and 8. The Z function of the transfer function of the second IIR filter is represented by the following equation.

(Equation 12)

$$H_{IIR2} = \frac{Cr}{Cr + Cg + Cb - Cbz^{-1}} \quad [12]$$

Further, the DC gain of in-phase mixer 302 can be determined by the following equation.

(Equation 13)

$$G_{DC} = \frac{8}{Cr + Cg} \quad [13]$$

According to equation 13, even if the number of decimations in the FIR filter is not changed, the DC gain can be determined by capacities Cr of Cr 7 and 8 to the total capacity Cg of gain control capacity section 310. Further, although, in this case, the cutoff frequency in the second step IIR filter changes depending on the total capacity Cg of gain control capacity section 310, the ratio of capacities Cr of Cr 7 and 8 to the capacity Cb of Cb 15 is decreased and the cutoff frequency in the second IIR filter cutoff frequency is set high. Furthermore, by setting the cutoff frequency in the first step IIR filter low, it is possible to suppress the degree of change of the cutoff frequency.

As described above, according to sampling mixer 300, in addition to the effect of Embodiment 1, it is possible to decrease the number of gain control capacity sections compared to the case of Embodiment 1. Consequently, it is possible to make circuits of the sampling mixer smaller.

Embodiment 4

Figure 5:
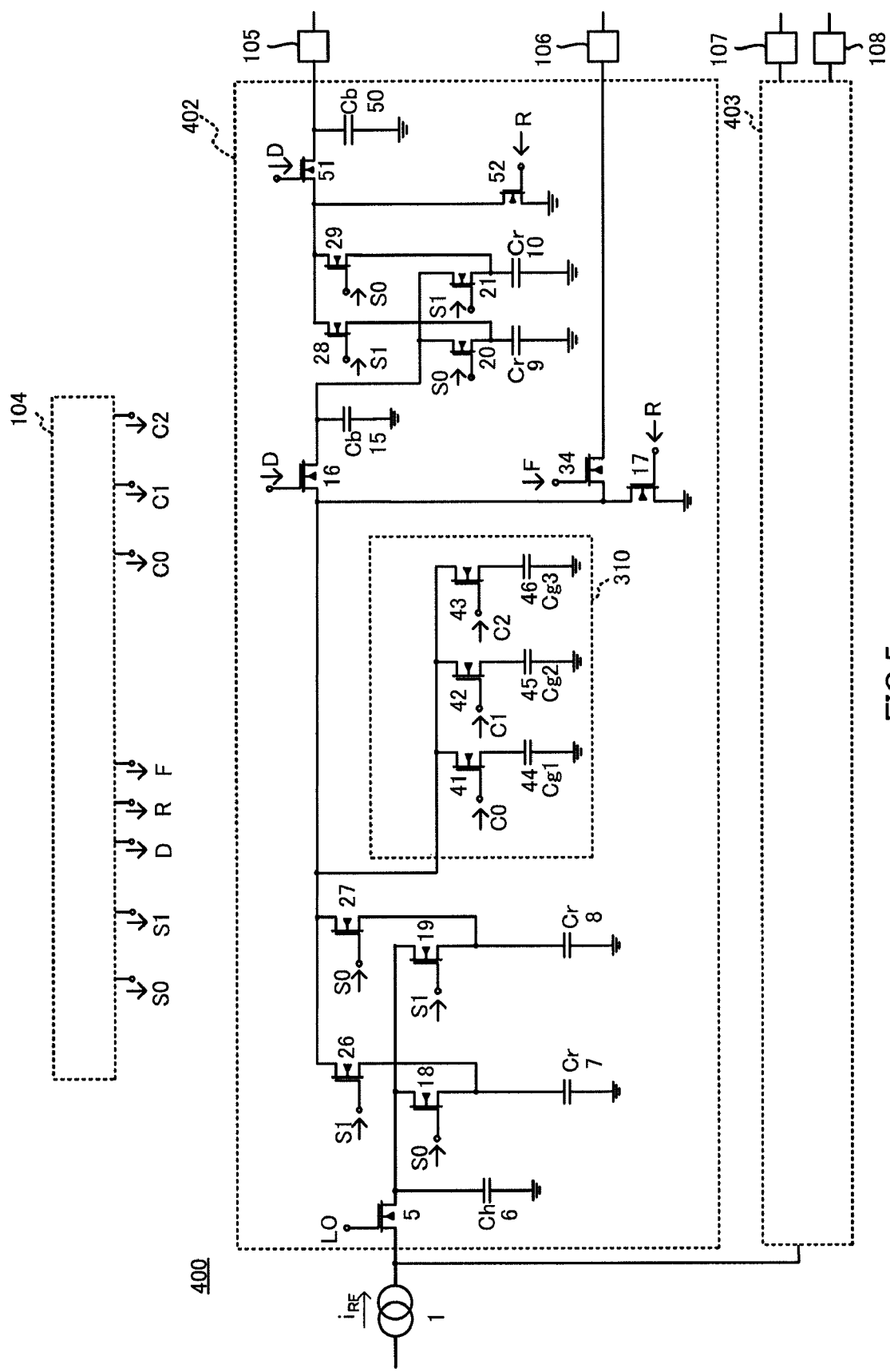
FIG. 5 shows an example of the sampling mixer circuit according to Embodiment 4 of the present invention.

FIG. 5 shows an example of a sampling mixer circuit according to Embodiment 4 of the present invention. Differences between the present embodiment and Embodiment 3 will be mainly described here.

Sampling mixer 400 is configured to include in-phase mixer 402 and reverse phase mixer 403 instead of in-phase mixer 302 and reverse phase mixer 303 of FIG. 4.

In in-phase mixer 402, the drain of dump switch 16 of FIG. 4 is connected to the drain of integration switch 21. The source of integration switch 21 is connected to one port of Cr 10, and the other port of Cr 10 is grounded.

Further, the drain of integration switch 20 is connected between the drain of dump switch 16 and the drain of integration switch 21, and the source of integration switch 21 is connected to one port of Cr 10. The other port of Cr 10 is grounded.

Then, the source of release switch 28 is connected between one port of Cr 9 and the source of integration switch 20. The drain of release switch 28 is connected to the source of dump switch 51. Further, the drain of release switch 29 is connected between the drain of release switch 28 and the source of dump switch 51. The source of release switch 29 is connected between the source of integration switch 21 and one port of Cr 10.

Further, one port of Cb 50 is connected between the drain of dump switch 51 and AD converter 105, and the other port of Cb 50 is grounded. Further, reverse phase mixer 403 is configured in virtually the same way as in in-phase mixer 402 except that reverse phase mixer 403 operates in the reverse phase. The other configuration of sampling mixer 400 is configured in the same way as in Embodiment 1.

By configuring sampling mixer 400 this way, Cr 7 and 8 are alternately connected to Cb 15, so that it is possible to produce an effect of a second step IIR filter. Further, Cr 9 and 10 are alternately connected to Cb 15, so that it is possible to produce an effect of a third step IIR filter.

To be more specific, as shown in FIG. 2, if the D signal also rises at a timing the S0 signal rises, two dump switches 16 and 51 are turned on. Then, Cb 15 is connected to Cr 8 through release switch 27 that is turned on, and signals held in Cr 8 are released to Cb 15 through dump switch 16 that is turned on. The present embodiment is the same as Embodiment 1 in this regard including the connecting operation of Cr 7.

Further, with the present embodiment, when the S0 signal shows the high level, dump switch 51 is also turned on, so that the following operation is further carried out. That is, Cb 50 is connected to Cr 10 through release switch 29 that is turned on, and signals held in Cr 10 are released to Cb 50 through release switch 29 that is turned on and dump switch 51.

Similarly, when the S1 signal shows the high level, if the D signal rises and dump switch 51 is turned on, Cb 50 is connected to Cr 9 through release switch 28 that is turned on. Then, signals held in Cr 9 are released to Cb 50 through release switch 28 that is turned on and dump switch 51.

By so doing, Cb 50, to which Cr 9 and 10 are connected alternately, holds the output potential. Consequently, it is possible to produce the above-described effect of a third step IIR filter.

When the second step IIR filter operates, gain control capacitors 44 to 46 reset integrated signals and, then, integrate signals released from Cr 7 and 8. The Z function of the transfer function of the second step IIR filter is represented by the following equation. Further, the capacities of Cr 9 and 10 are Cr 2.

(Equation 14)

$$H_{IIR2} = \frac{Cr}{Cr + Cg + Cr2 - Cbz^{-1}} \quad [14]$$

Further, the DC gain of in-phase mixer 402 can be determined by the following equation.

(Equation 15)

$$G_{DC} = \frac{8}{Cr + Cr2 + Cg} \quad [15]$$

According to equation 15, even if the number of decimations in the FIR filter is not changed, the DC gain can be determined by the ratio of capacities Cr of Cr 7 and 8, capacities Cr 2 of Cr 9 and Cr 10 and the total capacity Cg of gain control capacity section 310.

As described above, according to sampling mixer 400, in addition to the effect of Embodiment 3, it is possible to produce a greater degree of attenuation compared to Embodiment 3 thanks to the effect of a third IIR filter. By increasing the cutoff frequency in the second step IIR filter higher than the cutoff frequencies in the first step and third step IIR filters, it is possible to further decrease the degree of change of filter characteristics when the DC gain is made variable.

Embodiment 5

Figure 6:
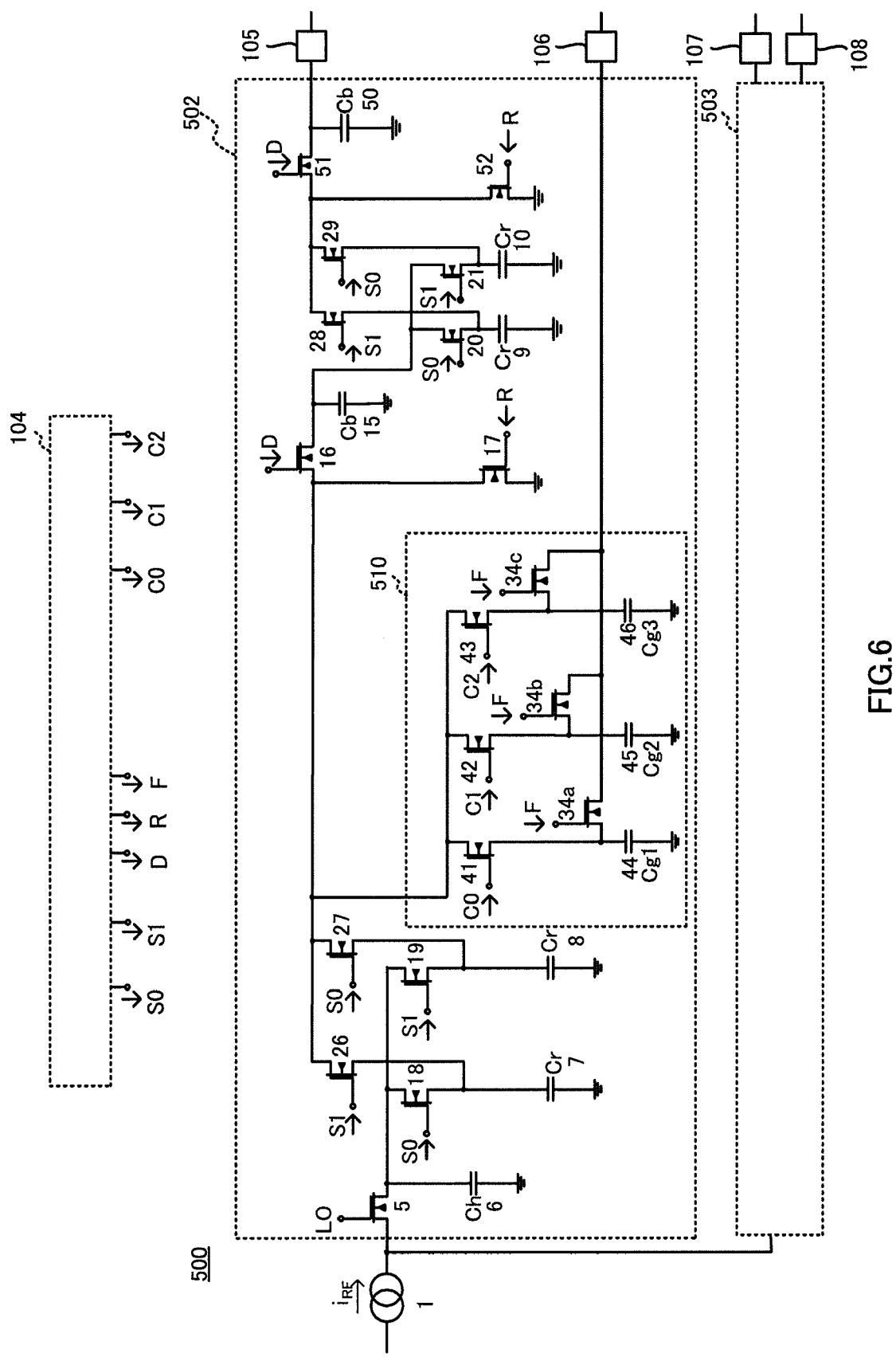
FIG. 6 shows an example of the sampling mixer circuit according to Embodiment 5 of the present invention.

FIG. 6 shows an example of a circuit of sampling mixer 500 according to Embodiment 5 of the present invention. Differences between the present embodiment and Embodiment 4 will be mainly described here.

Sampling mixer 500 is configured to include in-phase mixer 502 and reverse phase mixer 503 instead of in-phase mixer 402 and reverse phase mixer 403 of FIG. 5.

In-phase mixer 502 has gain control capacity section 510 instead of gain control capacity section 310 of FIG. 5.

Gain control capacity section 510 has three circuits connected in parallel, that is, a circuit composed of switching switch 41 and gain control capacitor 44, a circuit composed of switching switch 42 and gain control capacitor 45 and a circuit composed of switching switch 43 and gain control capacitor 46.

Feedback switch 34a is connected between the source of switching switch 41 and one port of gain control capacitor 44. Feedback switch 34a is composed of, for example, an n-type FET. Further, feedback switches 34b and 34c (described later) are composed of, for example, n-type FET's.

The source of feedback switch 34a is connected between the source of switching switch 41 and one port of gain control capacitor 44. Further, the drain of feedback switch 34a is connected to DA converter 106

The drain of feedback switch 34b is connected between the drain of feedback switch 34a and DA converter 106. Further, the source of feedback switch 34b is connected between the source of switching switch 42 and one port of gain control capacitor 45.

Furthermore, the drain of feedback switch 34c is connected between the drain of feedback switch 34a and DA converter 106. The source of feedback switch 34c is connected between the source of switching switch 43 and one port of gain control capacitor 46.

The gates of feedback switches 34a to 34c are configured to receive as input the F signal from control signal generator 104.

Further, the gate of switching switch 41, the gate of switching switch 42 and the gate of switching switch 43 are configured to received as input the C0 signal from control signal generator 104, the C1 signal from control signal generator 104 and the C2 signal from control signal generator 104, respectively.

Further, reverse phase mixer 503 is configured in the same way as in-phase mixer 502 except that reverse phase mixer 503 operates in the reverse phase. The other configuration of sampling mixer 500 is configured in the same way as in Embodiment 4.

By configuring sampling mixer 500 this way, when the F signal shows the high level, feedback switches 41 to 43 are turned on. Then, the above-described feedback signal is inputted to gain control capacity section 510 end from DA converter 106 through feedback switches 34a to 34c. By this means, when the second step IIR filter located at the end of the output terminal of sampling mixer 500 operates, compensation (DC offset) is carried out based on the feedback signal.

As described above, according to sampling mixer 500, in addition to the effect of Embodiment 4, the period the compensation operation converges by means of the feedback signal shortens because the input of the feedback signal is closer to the output terminal end compared to Embodiment 4.

Further, although a case has been described with Embodiment 5 where the feedback signal is inputted to all gain control capacitors 44 to 46, part of the gain control capacitors may be configured to receive as input the feedback signal.

Further, the feedback signal may be inputted only to the gain control capacitors supporting switching switches that are turned on.

Embodiment 6

FIG. 7 shows an example of a circuit of sampling mixer 600 according to Embodiment 6 of the present invention. Differences between the present embodiment and Embodiment 4 will be mainly described here.

Sampling mixer 600 is configured to include in-phase mixer 602 and reverse phase mixer 603 instead of in-phase mixer 402 and reverse phase mixer 403 of FIG. 5.

In-phase mixer 602 further has sampling switch 61 composed of, for example, an FET, in addition to sampling switch 5. The gate of sampling switch 61 is configured to receive as input the LOB signal with a phase delayed by 180 degrees from the LO signal. With such a configuration, in-phase mixer 602 receives as input the LO signal and LOB signal (these are collectively referred to as "differential mode signals").

The source of sampling switch 61 is connected in common to the output port of TA 60 and sampling switch 62 of reverse phase mixer 603. The drain of sampling switch 62 is connected to the drain of sampling switch 5 and one port of Ch 6.

Further, the other port of Ch 6 grounded in FIG. 5 of Embodiment 4 is connected to the drain of sampling switch 62. Similarly, other ports of Cb 15 and 50 of FIG. 5 and reset switches 17 and 52 are connected to reverse phase mixer 603 end.

Further, sampling mixer 600 has gain control capacity section 610 instead of gain control capacity section 310 of FIG. 5. Further, gain control capacitors 44 to 46 of gain control capacity section 610 are connected in common to both in-phase mixer 602 and reverse phase mixer 603.

With such a configuration, in Cr 7 to 10, Cb 15 and 50 and reset switches 17 and 52, it is possible to differentially combine the output signals of in-phase mixer 602 and reverse phase mixer 603. Further, in gain control capacitors 44 to 46, it is possible to differentially combine the output signals of in-phase mixer 602 and reverse phase mixer 603.

As described above, according to sampling mixer 600, in addition to the effect of Embodiment 4, for example, Cr 7 can be shared in both of in-phase mixer 602 and reverse phase mixer 603, so that it is possible to produce an effect of making sampling mixer 600 smaller.

Embodiment 7

Figure 8:
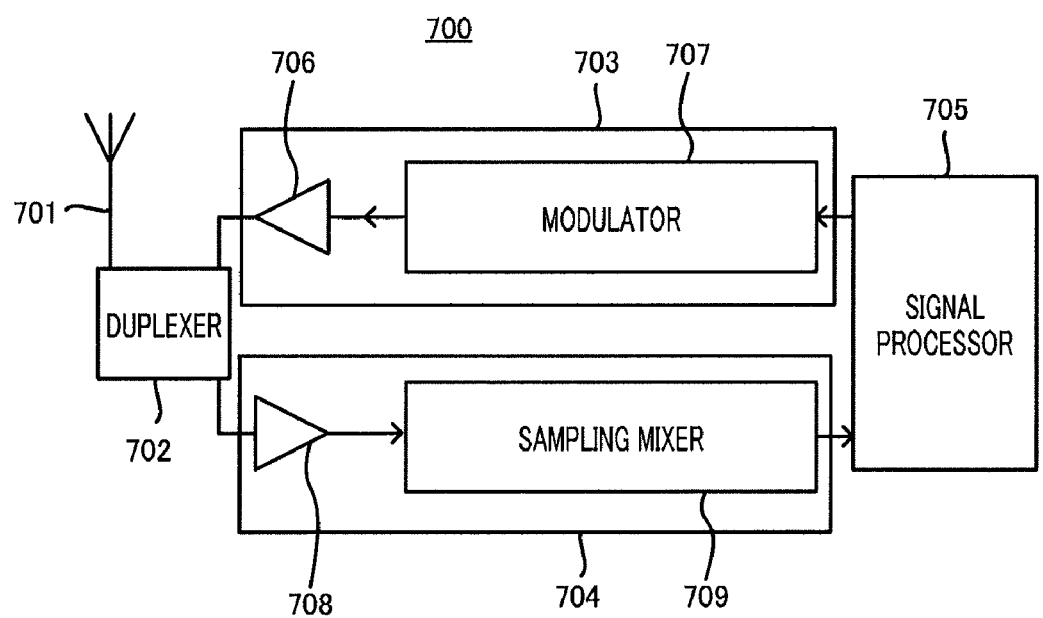
FIG. 8 shows a configuration example of a radio apparatus according to Embodiment 7 of the present invention.
Figure 9:
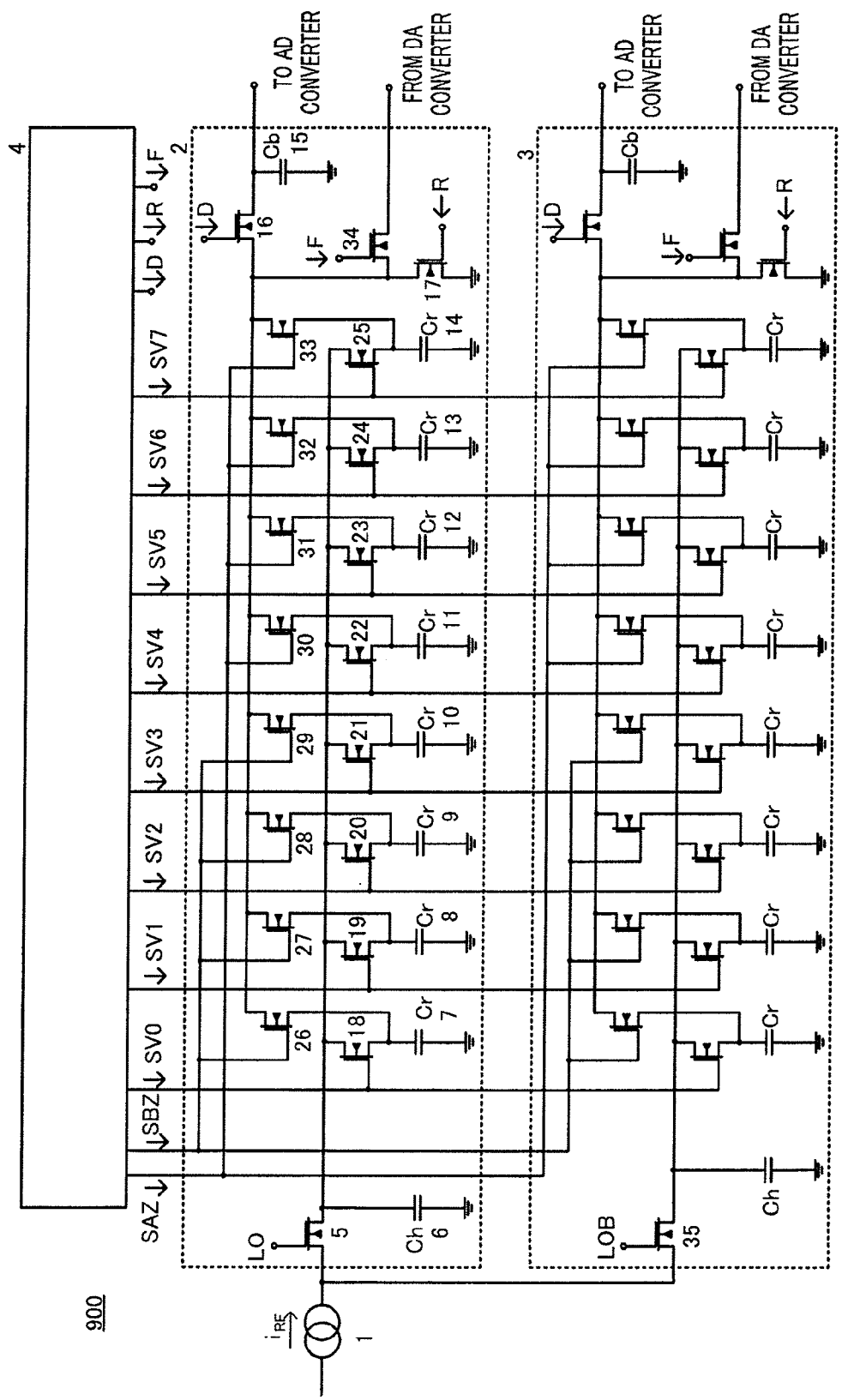
FIG. 9 is a circuit diagram of a conventional sampling mixer.
Figure 10:
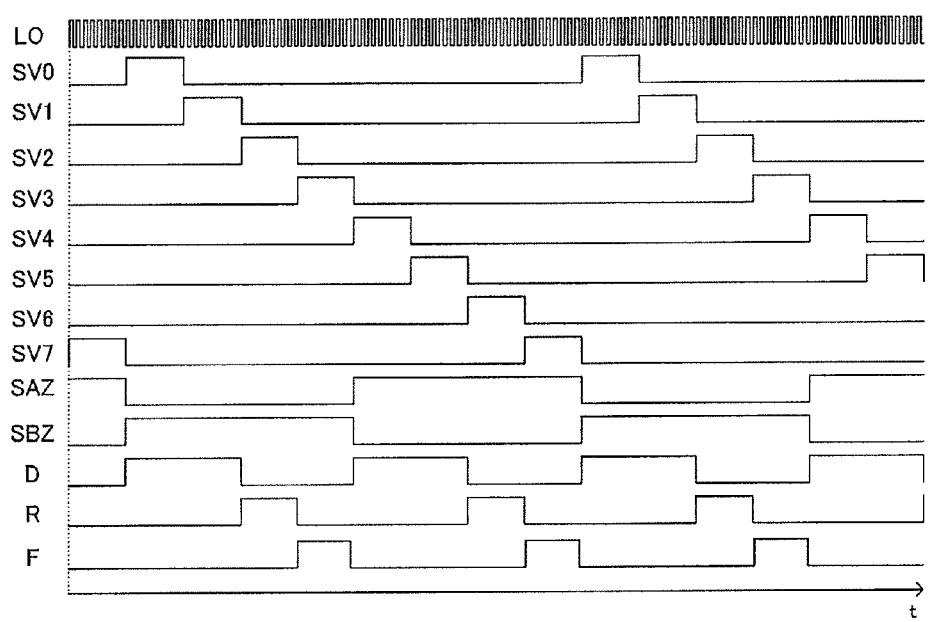
FIG. 10 is a timing chart of the control signal of a conventional sampling mixer.

FIG. 8 is a block diagram showing a configuration example of radio apparatus 700 in Embodiment 7 of the present invention. Radio apparatus 700 refers to, for example, a mobile telephone, automobile telephone and transceiver.

In FIG. 8, radio apparatus 700 has antenna 701, duplexer 702, transmitter 703, receiver 704 and signal processor (DSP) 705.

Further, transmitter 703 has power amplifier (PA) 706 and modulator 707. Receiver 704 has low noise amplifier (LNA) 708 and sampling mixer 709. For example, sampling mixer 100 in Embodiment 1 of FIG. 1 is used for sampling mixer 709. By so doing, one of sampling mixers in Embodiments 2, 3, 4 and 5 may be used for sampling mixer 709 (see FIG. 3 to FIG. 7).

Antenna 701 is connected with transmitter 703 and receiver 704 through duplexer 702.

Duplexer 702 supports each frequency band of a transmission signal and received signal. Further, when receiving as input a signal from transmitter 703, duplexer 702 makes the frequency band of the transmission signal in the signal pass, and outputs the result to antenna 701. On the other hand, when duplexer 702 receives as input a signal from antenna 701, duplexer 702 makes the frequency band of the received signal in the signal pass, and outputs the result to receiver 704.

Signal processor 705 carries out AD conversion of the output signal from receiver 704 and then carries out signal processing (for example, speech processing and data processing) of the output signal. Further, signal processor 705 carries out signal processing of a predetermined input signal (for example, speech and data), carries out DA conversion (not shown) of the signal and outputs the signal to transmitter 703.

By configuring radio apparatus 700 this way, it is possible to produce an effect of the above-described sampling mixer. That is, it is possible to determine the DC gain of the IIR filter based on the ratio of the capacity of Cr to the total capacity of the gain control capacity sections. Consequently, the present invention is useful because the requirement of setting the total capacity of the sampling mixer, DC gain and the cutoff frequency of filter characteristics can be flexibly determined.

Further, by making variable the total amount of gain control capacities, it is possible to control the value of the DC gain.

Further, it is possible to make a circuit of the sampling mixer smaller compared to the method of controlling the DC gain by changing capacities of Ch, Cr and Cb. By making the DC gain variable, it is possible to reduce deterioration of reception sensitivity due to distortion.

Further, although cases of a sampling mixer or a radio apparatus including this sampling mixer have been described with Embodiments 1 to 7, a discrete filter not including sampling switch 5 or a radio apparatus including this discrete filter may be applied.

The disclosure of Japanese Patent Application No. 2006-170452, filed on Jun. 20, 2006, including the specification, drawings and abstract, is incorporated herein by reference in its entirety.

Industrial Applicability

The discrete filter and sampling mixer according to the present invention are useful for a radio circuit built in the radio apparatus. Particularly, the discrete filter and sampling mixer are suitable to carry out a frequency conversion of signals.

The invention claimed is:

1. A discrete filter comprising:
a control signal generator that generates a plurality of control signals of a same frequency and varying phases;
a history capacitor that integrates a received signal;
a capacitor group comprised of m rotate capacitors (where m is a natural number of two or greater) that are sequentially connected in parallel with the history capacitor and integrate the received signal; and
a buffer capacitor that integrates a signal released from the capacitor group, wherein:
the m rotate capacitors forming the capacitor group integrate the received signal at respective timings based on the plurality of control signals; and
the plurality of m rotate capacitors are divided into a plurality of groups based on timings at which the integrated received signal is released, and release the integrated received signal to the buffer capacitor such that at least part of a period in which the received signal is integrated in rotator capacitors forming one group selected from the plurality of groups and a period in which a received signal integrated in a period prior to the part of the period, is released from rotate capacitors forming other groups than the selected one group, overlap in the time domain,
the discrete filter comprises a capacity adjusting section that is connected in parallel with the capacitor group and the buffer capacitor and that adjusts an amount of integration of the signal released from the capacitor group and integrated in the buffer capacitor.

2. The discrete filter according to claim 1, wherein the capacity adjusting section has a capacitor and a switching switch that switches a state of connection between the capacitor and the capacitor group.

3. The discrete filter according to claim 1, wherein the capacity adjusting section comprises a plurality of capacitors and a plurality of switching switches that switch states of connection between the plurality of capacitors and the capacitor group, and adjusts an amount of integration carried out in the buffer capacitor by switching on and off states of the plurality of switching switches and changing capacitors to be connected with the capacitor group.

4. The discrete filter according to claim 1, further comprising a reset switch that is connected with the capacity adjusting section and that resets signals accumulated in the capacity adjusting section,
wherein the reset switch is turned on after a predetermined period from a start timing of a release period of the capacitor group and is turned off before the start timing of a next release period.

5. The discrete filter according to claim 1, further comprising, subsequent to the buffer capacitor:
a second capacitor group that comprises the same structure as the capacitor group; and
a second buffer capacitor that integrates a signal released from the second capacitor group.

6. A discrete filter that connects two discrete filters according to claim 1 in parallel, uses input signals supplied to the discrete filters as differential mode signals and shares between differentials the capacitor group of the two discrete filters connected in parallel.

7. A sampling mixer comprising:
a discrete filter according to claim 1; and
a sampling switch that is provided prior to the discrete filter and that samples a received signal at a predetermined frequency.

8. A radio apparatus comprising:
a discrete filter according to claim 1;
a signal processor that carries out signal processing based on an output signal of the discrete filter; and
a modulator that modulates the output signal after the signal processing in the signal processor.

9. A radio apparatus comprising:
a sampling mixer according to claim 7;
a signal processor that carries out signal processing based on an output signal of the discrete filter; and
a modulator that modulates the output signal after the signal processing in the signal processor.

10. A discrete filter comprising:
a control signal generator that generates a plurality of control signals of a same frequency and varying phases;
a history capacitor that integrates a received signal;
a capacitor group comprised of m rotate capacitors (where m is a natural number of two or greater) that are sequentially connected in parallel with the history capacitor at respective timings based on the plurality of control signals and integrate the received signal; and
a buffer capacitor that integrates a signal released from the capacitor group, wherein:
the m rotate capacitors are divided into a plurality of groups based on timings at which the integrated received signal is released, and release the integrated received signal to the buffer capacitor such that at least part of a period in which the received signal is integrated in rotator capacitors forming one group selected from the plurality of groups and a period in which the received signal integrated in rotate capacitors forming other groups than the selected one group overlap in the time domain,
the discrete filter comprises m capacity adjusting sections that are connected in parallel with the m rotate capacitors and that adjust an amount of integration of the received signal integrated in the rotate capacitors.

11. The discrete filter according to claim 10, wherein the m capacity adjusting sections each have a capacitor and a switching switch that switches a state of connection between the capacitor and the capacitor group.

12. The discrete filter according to claim 10, wherein the m capacity adjusting sections comprise a plurality of capacitors and a plurality of switching switches that switch states of connection between the plurality of capacitors and the capacitor group, and adjust an amount of integration carried out in the buffer capacitor by switching on and off states of the plurality of switching switches and changing capacitors to be connected with the capacitor group.

13. The discrete filter according to claim 10, further comprising, subsequent to a first buffer capacitor:
a second capacitor group that comprises m rotate capacitors (where m is a natural number of two or greater); and
a second buffer capacitor that integrates a signal released from the second capacitor group,
wherein the m rotate capacitors forming the second capacitor group are each connected to the first buffer capacitor in a same period as a period in which rotate capacitors of an applicable first capacitor group integrate the received signal and are each connected to the second buffer capacitor in a same period as a period in which the rotate capacitors of the applicable first capacitor group release the received signal.

14. A discrete filter that connects two discrete filters according to claim 10 in parallel, uses input signals supplied to the discrete filters as differential mode signals and shares between differentials the capacitor group of the two discrete filters connected in parallel.

15. A sampling mixer comprising:
a discrete filter according to claim 10; and
a sampling switch that is provided prior to the discrete filter and that samples a received signal at a predetermined frequency.

16. A radio apparatus comprising:
a discrete filter according to claim 10;
a signal processor that carries out signal processing based on an output signal of the discrete filter; and
a modulator that modulates the output signal after the signal processing in the signal processor.

17. A radio apparatus comprising:
a sampling mixer according to claim 15;
a signal processor that carries out signal processing based on an output signal of the discrete filter; and
a modulator that modulates the output signal after the signal processing in the signal processor.

* * * * *